(12) United States Patent
Martin

(10) Patent No.: US 6,211,600 B1
(45) Date of Patent: Apr. 3, 2001

(54) SURFACE ACOUSTIC WAVE COMPONENT

(75) Inventor: Guenter Martin, Dresden (DE)

(73) Assignee: Dover Europe GmbH, Steinbach/Ts (DE)

( * ) Notice: Subject to any disclaimer, the term of this patent is extended or adjusted under 35 U.S.C. 154(b) by 0 days.

(21) Appl. No.: 09/263,619

(22) Filed: Mar. 5, 1999

(30) Foreign Application Priority Data

Mar. 25, 1998 (DE) .............................................. 198 12 991

(51) Int. Cl.[7] ..................................................... H03H 9/25

(52) U.S. Cl. .................................. 310/313 D; 310/313 B

(58) Field of Search ........................... 310/313 R, 313 B, 310/313 D

(56) References Cited

U.S. PATENT DOCUMENTS

| | | | |
|---|---|---|---|
| 5,313,177 | * 5/1994 | Hickernell et al. ................... | 333/193 |
| 5,438,306 | * 8/1995 | Yamanouchi et al. ............... | 333/195 |
| 5,521,565 | * 5/1996 | Anemogiannis ..................... | 333/195 |
| 5,703,427 | * 12/1997 | Solal et al. ....................... | 310/313 D |
| 5,773,911 | * 6/1998 | Tanaka et al. .................... | 310/313 B |
| 6,011,344 | * 1/2000 | Dufilie et al. .................... | 310/313 B |

FOREIGN PATENT DOCUMENTS

| | | | |
|---|---|---|---|
| 199 07 640 | * 10/1999 | (DE) ................................. | 310/313 B |
| 3-132208 | * 6/1991 | (JP) .................................. | 310/313 B |
| 11-319937 | * 2/1999 | (JP) .................................. | 310/313 B |

OTHER PUBLICATIONS

Design of High Selectivity DART SPUDT Filters on Quartz and Lithium Tantalate, E.M. Garber, D.S. Yip, a.nd D..K. Henderson, TRW, One Space Park, Redondo Beach, CA 90278, 1994, IEEE. Dec. 1997.

A New Concept in SPUDT Design: The RSPUDT (Resonant SPUDT), P. Ventura et al., Thomson microsonics 1994, IEEE.. Dec. 1997.

Overview of Design Challenges for Single Phase Unidirectional Saw Filters, C.S. Hartmann & B.P. Abbott, 1989, IEEE.. Dec. 1989.

* cited by examiner

Primary Examiner—Thomas M. Dougherty
(74) Attorney, Agent, or Firm—Reed Smith LLP

(57) ABSTRACT

An improvement of a surface acoustic wave component is disclosed. Surface acoustic wave components of the known type are changed in such a way that the dependency of the insertion loss and/or group delay time on the frequency as asymmetric function in relation to the center frequency can be realized in a predetermined manner. Sloping passbands are particularly significant in this respect. As disclosed, in a surface acoustic wave component in which two single-phase unidirectional transducers which are composed of finger groups comprising a pair of fingers and a reflection finger are arranged on a piezoelectric substrate, wherein the two fingers of the pair of fingers have opposite polarity and are at a distance of one quarter wavelength from one another, at least one base element in at least one of the single-phase unidirectional transducers differs from the rest of the base elements with respect to its distance between the center of the reflection finger and the center of the nearest finger of its pair of fingers. The device of the invention is applicable, for example, for bandpass filters with a relative bandwidth of up to several percent and for oscillators.

28 Claims, 1 Drawing Sheet

SURFACE ACOUSTIC WAVE COMPONENT

BACKGROUND OF THE INVENTION a) Field of the Invention

The invention is directed to the field of electrical engineering and electronics. Objects in which the invention may possibly and advantageously be applied are components based on surface acoustic waves such as bandpass filters with a relative bandwidth of up to several percent and oscillators.

b) Description of the Related Art

Surface acoustic wave components are known in which two single-phase unidirectional transducers which are composed of base elements comprising a pair of fingers and a reflection finger are arranged on a piezoelectric substrate, wherein the two fingers of the pair of fingers have opposite polarities and are at a distance of one quarter wavelength from one another. One of the fingers of the pair of fingers and the reflection fingers are connected with ground potential, while the second finger of the pair of fingers is connected to a potential not equal to the ground potential (C. S. Hartmann and B. P. Abbott, 1989 IEEE Ultrasonics Symposium Proceedings, pages 79–89 [1]; E. M. Garber, D. S. Yip and D. K. Henderson, 1994 IEEE Ultrasonics Symposium Proceedings, pages 7–12 [2]). The single-phase unidirectional transducer is designated as such or, in abbreviated form, as SPUDT in English-language technical literature.

In a special construction (P. Ventura, M. Solal, P. Dufilié, J. M. Hodé and F. Roux, 1994 IEEE Ultrasonics Symposium Proceedings, pages 1–6 [3]), as also in [1] and [2], the distance from the center of the reflection finger to the center of the nearest finger of the respective pair of fingers is the same in all base elements of both single-phase unidirectional transducers. The distance of the effective location of wave excitation from that of reflection, referred to as the excitation center and reflection center, respectively, is ⅜ of the wavelength. The reflection centers are located in the center of the reflection fingers, while the excitation centers are positioned close to the center of those fingers of the pairs of fingers connected to a potential other than ground potential.

Due to the distance of one quarter wavelength between the two fingers of a pair of fingers, the pairs of fingers are non-reflecting, but excite surface acoustic waves, namely, effectively at the site of the excitation center. Reflections take place exclusively at the reflection fingers. Because of the distance of ⅜ of the wavelength between the excitation center and reflection center, there is a phase difference of $3\pi/2$ between the directly emitted wave and the reflected wave. In this respect, the phase displacement of $\pi/2$ is summed due to the reflection at a finger with front edge and rear edge and therefore gives a total phase displacement of $2\pi$, wherein the reflection factor at an edge is assumed to be real. Consequently, directly emitted waves and reflected waves overlap constructively in the direction pointing from the reflection finger to the pair of fingers of one and the same base element. Typically, a single-phase unidirectional transducer is formed of a periodic arrangement of base elements with a period length equal to a wavelength. Therefore, the distance of an excitation center (approximately the center of the finger of a pair of fingers not connected to ground potential) from the next reflection finger in the opposite direction is ⅝ of the wavelength, which gives a phase displacement of $3\pi$ between the wave emitted in the opposite direction and the wave reflected in the opposite direction. In other words, with respect to the directly emitted waves, the reflected waves are real. Consequently, in the direction pointing from the pair of fingers to the reflection finger of one and the same base element, the directly emitted waves and reflected waves overlap destructively. Accordingly, a greater wave amplitude is radiated in the direction pointing from the reflection fingers to the pair of fingers of one and the same base element than in the opposite direction and this is therefore designated as the forward direction.

Because of this characteristic, interdigital transducers which radiate in essentially only one direction can be constructed on the principle of the single-phase unidirectional transducer so as to prevent losses due to wave radiation in unused directions. Therefore, the principle is suitable for producing components with low insertion loss. However, it must be ensured that echoes due to reflections at the transducers as a whole do not interfere with the transmission behavior. In constructions [1] and [2] referred to above, the reflection of every transducer is suppressed. Apart from suitable selection of matching networks, this is accomplished primarily by the adjustment of spatially-dependent reflection factors of the reflection fingers from one base element to next base element. In construction [3] above, however, not only are the echoes resulting from reflections at the transducers not suppressed, they are even utilized for structuring the transmission behavior. Accordingly, filters with a small form factor (ratio of 30-dB bandwidth to 3-dB bandwidth), that is, with steep edges, can be realized without the very long layouts which are otherwise necessary.

However, construction [3] has the disadvantage that frequency dependencies of insertion loss and/or group delay time which are asymmetric relative to the center frequency, for example, sloping passbands, cannot be realized in a predetermined manner.

OBJECT AND SUMMARY OF THE INVENTION

It is the primary object of the invention to change surface acoustic wave components of the known type in such a way that the dependency of the insertion loss and/or group delay time on the frequency as asymmetric function in relation to the center frequency can be realized in a predetermined manner. Sloping passbands are particularly significant in this respect.

This object is met by the surface acoustic wave component in accordance with the invention in which two single-phase unidirectional transducers which are composed of base elements comprising a pair of fingers and a reflecting finger are arranged on a piezoelectric substrate, wherein the two fingers of the pair of fingers have opposite polarity and are at a distance of one quarter wavelength from one another and wherein at least one base element in at least one of the single-phase unidirectional transducers is distinguished from the rest of the base elements by its distance between the center of the reflection finger and the center of the nearest finger of its pair of fingers.

This feature means that the distance between the excitation center and the reflection center does not equal ⅜ of the wavelength in every base element and that, consequently, the phase difference between the reflected waves and the waves which are emitted directly without reflection is no longer an integral multiple of $\pi$ for all base elements. Through a suitable selection of the spatial dependency of the deviation of the distance of the excitation center and reflection center from the value of ⅜ of the wavelength, which value is given in all of the base elements of solutions [1], [2]

and [3], a determined dependency of said phase difference on the position of the base elements is adjusted. This contributes to the frequency dependency of insertion loss and group delay time which are asymmetric to the center frequency. As a whole, there results a transmission behavior which is asymmetric to the center frequency.

According to a first construction of the invention, every base element of each of the two single-phase unidirectional transducers is allotted the distance of the center of the reflection finger from the center of the nearest finger of its pair of fingers by means of a distance assignment. For this purpose, the distance assignment of one single-phase unidirectional transducer can differ from that of the other single-phase unidirectional transducer; however, the distance assignments of the single-phase unidirectional transducers can also be identical. Another possibility consists in that the distance of the center of the reflection finger from the center of the nearest finger of the pair of fingers of one and the same base element is identical for the two respective base elements to the right and left of the center of the respective single-phase unidirectional transducer with the same number, counting from this center.

According to another construction of the invention which serves for the adjustment of a sloping passband, the distance to the center of the reflection finger of that base element of the first single-phase unidirectional transducer that is adjacent to the second single-phase unidirectional transducer to the center of the reflection finger of that base element of the second single-phase unidirectional transducer that is adjacent to the first single-phase unidirectional transducer is an odd multiple of an eighth of the wavelength. In this respect, it is extremely advisable to determine the distance assignments of the two single-phase unidirectional transducers according to a method which minimizes the discrepancy between the achieved parameters of the surface acoustic wave component and the desired parameters of the surface acoustic wave component.

When the intermediate space between a reflection finger and a finger adjacent to the latter is too small in some base elements due to the deviation of the distance of the excitation center and reflection center from the value ⅜ of the wavelength, it is advisable to increase the distance between the centers of the reflection fingers of adjacent base elements relative to the distance value given by the distance assignment by an integral multiple V of the wavelength. In doing so, the distance between the centers of all corresponding fingers of adjacent base elements can be carried out by an integral multiple V of the wavelength, or the distance between the center lines of the pairs of fingers extending parallel to the finger edges is increased by an integral multiple V-1 of the wavelength.

Proceeding from the first construction of the invention shown above, according to which every base element of each of the two single-phase unidirectional transducers is allotted the distance of the center of the reflection finger from the center of the nearest finger of its pair of fingers by means of a distance assignment, a further feature of the invention consists in that the distance assignment contains a periodic function of the number of the base element counted in every transducer from left to right. This periodic function is advisably carried out in a modulated manner, preferably by an exponential function.

According to another arrangement of the invention, in the base elements which differ from the rest of the base elements with respect to their distance between the center of the reflection finger and the center of the nearest finger of its pair of fingers, said difference is determined exclusively by the position of the respective reflector finger.

The invention is explained more fully hereinafter with reference to an embodiment example and an accompanying drawing.

BRIEF DESCRIPTION OF THE DRAWINGS

The drawing is a schematic and diagrammatic representation of the present invention.

DESCRIPTION OF THE PREFERRED EMBODIMENTS

Figure 1:
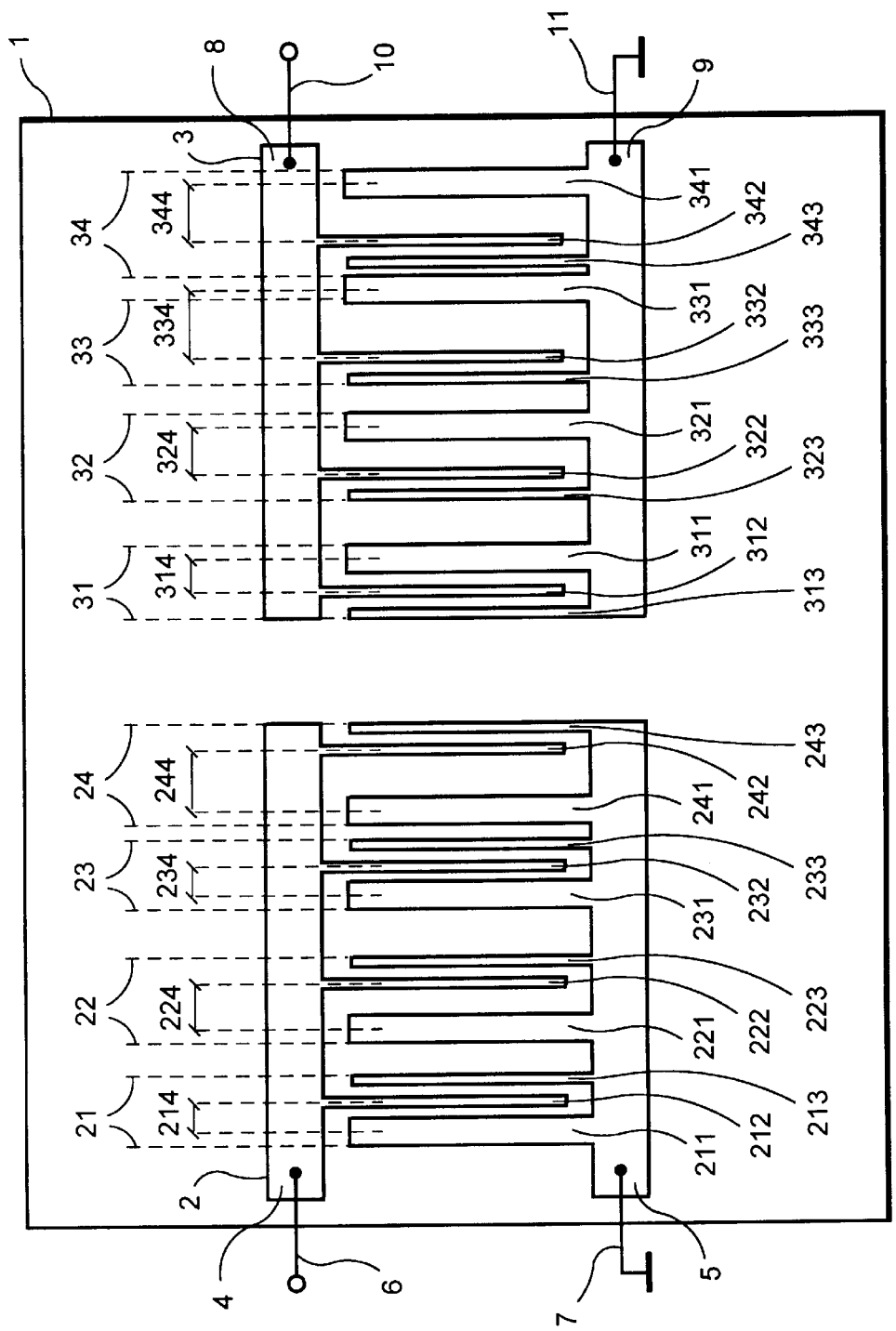

The example relates to a surface acoustic wave component in which a first and second single-phase unidirectional transducer 2 and 3, respectively, with bus bars 4, 5 and 8, 9 and base elements 21, 22, 23, 24 and 31, 32, 33, 34, each of which base elements represents a finger group, are arranged on a piezoelectric substrate 1. Connected with the bus bar 5 of the single-phase unidirectional transducer 2 are reflection fingers 211, 221, 231, 241 and fingers 213, 223, 233, 243 which, together with fingers 212, 222, 232, 242 which are connected with the bus bar 4, form pairs of fingers. These pairs of fingers, together with the reflection fingers 211, 221, 231 and 241, form the base elements 21, 22, 23 and 24 in the same order. The distances 214, 224, 234, 244 between the center lines of the reflection fingers 211, 221, 231, 241 parallel to the finger edges and the center lines of the adjacent fingers 212, 222, 232, 242 differ from one another. In this way it is ensured that the phase difference between at least three of the waves reflected at the reflection fingers 211, 221, 231, 241 and the waves which are directly excited by the excitation centers of the fingers 212, 222, 232, 242 is not equal to an integral multiple of $\pi$. This is the precondition for the single-phase unidirectional transducer 2 having an asymmetric transmission behavior.

This also applies in an analogous manner for the single-phase unidirectional transducer 3. Connected with the bus bar 9 of the single-phase unidirectional transducer 3 are reflection fingers 311, 321, 331, 341 and fingers 313, 323, 333, 343 which, together with fingers 312, 322, 332, 342 which are connected with the bus bar 8, form pairs of fingers. These pairs of fingers, together with the reflection fingers 311, 321, 331, 341, form the base elements 31, 32, 33, 34 in the same order. The distances 314, 324, 334, 344 between the center lines of the reflection fingers 311, 321, 331, 341 parallel to the finger edges and the center lines of the adjacent fingers 312, 322, 332, 342 differ from one another. In this way it is ensured that the phase difference between at least three of the waves reflected at the reflection fingers 311, 321, 331, 341 and the waves which are directly excited by the excitation centers of the fingers 312, 322, 332, 342 is not equal to an integral multiple of $\pi$. This is the precondition for the single-phase unidirectional transducer 3 having an asymmetric transmission behavior.

In all of the base elements 21, 22, 23, 24 and 31, 32, 33, 34, the direction from the respective reflection fingers to the respective pair of fingers points in the direction of the other respective single-phase unidirectional transducer. The distance of the centers of the fingers belonging to one and the same pair of fingers is always a fourth of the wavelength and the width of these fingers is always an eighth of the wavelength.

The respective bus bars 4 and 8 of the single-phase unidirectional transducer 2 and 3 are connected to the input and output, respectively, of the component via connections 6 and 10, respectively, while bus bars 5 and 9 are connected to ground potential via connections 7 and 11, respectively.

While the foregoing description and drawings represent the preferred embodiments of the present invention, it will be obvious to those skilled in the art that various changes and modifications may be made therein without departing from the true spirit and scope of the present invention.

What is claimed is:

1. A surface acoustic wave component comprising:
   two single-phase unidirectional transducers which are composed of finger groups comprising a pair of fingers and a reflection finger being arranged on a piezoelectric substrate;
   two fingers of the pair of fingers having opposite polarity and being at a distance of one quarter wavelength from one another; and wherein
   at least one of the finger groups in at least one of the single-phase unidirectional transducers is distinguished from the rest of the finger groups by its different distance between the center of the reflection finger and the center of a nearest finger of its pair of fingers.

2. The surface acoustic wave component according to claim 1, wherein every finger group of each of the two single-phase unidirectional transducers is allotted a distance of the center of the reflection finger from the center of a nearest finger of its pair of fingers by a distance assignment.

3. The surface acoustic wave component according to claim 2, wherein the distance assignment of one single-phase unidirectional transducer differs from that of the other single-phase unidirectional transducer.

4. The surface acoustic wave component according to claim 2, wherein the distance assignments of the two single-phase unidirectional transducers are identical.

5. The surface acoustic wave component according to claim 2, wherein the distance of the center of the reflection finger from the center of the nearest finger of the pair of fingers of one and the same finger group is identical for the two respective finger groups to the right and left of the center of the respective single-phase unidirectional transducer with the same number, counting from this center.

6. The surface acoustic wave component according to claim 1, wherein a distance from the center of the reflection finger of a finger group of the first single-phase unidirectional transducer that is adjacent to the second single-phase unidirectional transducer to the center of the reflection finger of a finger group of the second single-phase unidirectional transducer that is adjacent to the first single-phase unidirectional transducer is an odd multiple of an eighth of the wavelength.

7. The surface acoustic wave component according to claim 2, wherein the distance assignments of the two single-phase unidirectional transducers are determined according to a method which minimizes the discrepancy between the achieved parameters of the surface acoustic wave component and the desired parameters of the surface acoustic wave component.

8. The surface acoustic wave component according to claim 2, wherein a distance between the centers of the reflection fingers of some adjacent finger groups relative to the distance value given by the distance assignment is increased by an integral multiple V of the wavelength.

9. The surface acoustic wave component according to claim 8, wherein a distance between the centers of all corresponding fingers of adjacent finger groups is increased by an integral multiple V of the wavelength.

10. The surface acoustic wave component according to claim 8, wherein a distance between the center lines of the pairs of fingers extending parallel to the finger edges is increased by an integral multiple V-1 of the wavelength.

11. The surface acoustic wave component according to claim 2, wherein the distance assignment contains a periodic function of a number of the finger group counted in every transducer from left to right.

12. The surface acoustic wave component according to claim 11, wherein the periodic function is modulated.

13. The surface acoustic wave component according to claim 12, wherein the periodic function is modulated by an exponential function.

14. The surface acoustic wave component according to claim 1, wherein the at least one of the finger groups, which differ from the rest of the finger groups with respect to their distance between the center of the reflection finger and the center of the nearest finger of its pair of fingers, differ exclusively by the position of the respective reflector finger.

15. A surface acoustic wave component in which two single-phase unidirectional transducers are arranged on a piezoelectric substrate, wherein every single-phase unidirectional transducer comprises two collector bus bars from which emanate a plurality of fingers;
   and wherein every three successive fingers of which two successive fingers have the same width form a finger group;
   and wherein the two fingers having the same width emanate from different collector bus bars and therefore form a finger pair, wherein the distance between the centers of these two fingers is one quarter of the wavelength;
   and wherein the respective third finger of the finger groups is a reflection finger;
   and wherein every single-phase unidirectional transducer is composed of a plurality of finger groups, characterized in that in at least one of the single-phase unidirectional transducers, the distance between the center of the reflection finger and the center of the nearest finger of the finger pair of the respective finger group differs from the corresponding distance in the rest of the finger groups, so that in at least one of the single-phase unidirectional transducers there are at least two successive finger groups in which the distance between the center of the reflection finger and the center of the nearest finger of the respective finger pair is different.

16. The surface acoustic wave component according to claim 15, wherein every finger group of each of the two single-phase unidirectional transducers is allotted a distance of the center of the reflection finger from the center of the nearest finger of its pair of fingers by a distance assignment.

17. The surface acoustic wave component according to claim 16, wherein the distance assignment of one single-phase unidirectional transducer differs from that of the other single-phase unidirectional transducer.

18. The surface acoustic wave component according to claim 16, wherein the distance assignments of the two single-phase unidirectional transducers are identical.

19. The surface acoustic wave component according to claim 16, wherein the distance of the center of the reflection finger from the center of the nearest finger of the pair of fingers of one and the same finger group is identical for the two respective finger groups to the right and left of the center of the respective single-phase unidirectional transducer with the same number, counting from this center.

20. The surface acoustic wave component according to claim 15, wherein a distance from the center of the reflection finger of a finger group of the first single-phase unidirectional transducer that is adjacent to the second single-phase unidirectional transducer, to the center of the reflection finger of a finger group of the second single-phase unidirectional transducer that is adjacent to the first single-phase unidirectional transducer is an odd multiple of an eighth of the wavelength.

21. The surface acoustic wave component according to claim 16, wherein the distance assignments of the two single-phase unidirectional transducers are determined according to a method which minimizes the discrepancy between the achieved parameters of the surface acoustic wave component and the desired parameters of the surface acoustic wave component.

22. The surface acoustic wave component according to claim 16, wherein a distance between the centers of the reflection fingers of some adjacent finger groups relative to the distance value given by the distance assignment is increased by an integral multiple V of the wavelength.

23. The surface acoustic wave component according to claim 22, wherein a distance between the centers of all corresponding fingers of adjacent finger groups is increased by an integral multiple V of the wavelength.

24. The surface acoustic wave component according to claim 22, wherein a distance between the center lines of the pairs of fingers extending parallel to the finger edges is increased by an integral multiple V-1 of the wavelength.

25. The surface acoustic wave component according to claim 16, wherein the distance assignment contains a periodic function of the number of a finger group counted in every transducer from left to right.

26. The surface acoustic wave component according to claim 25, wherein the periodic function is modulated.

27. The surface acoustic wave component according to claim 26, wherein the periodic function is modulated by an exponential function.

28. The surface acoustic wave component according to claim 15, wherein the at least two successive finger groups which differ from the rest of the finger groups with respect to their distance between the center of the reflection finger and the center of the nearest finger of its pair of fingers, differ exclusively by the position of the respective reflector finger.

* * * * *